United States Patent
Fujito et al.

(10) Patent No.: US 8,269,251 B2
(45) Date of Patent: Sep. 18, 2012

(54) METHOD FOR PRODUCING GROUP III NITRIDE SEMICONDUCTOR CRYSTAL, GROUP III NITRIDE SEMICONDUCTOR SUBSTRATE, AND SEMICONDUCTOR LIGHT-EMITTING DEVICE

(75) Inventors: Kenji Fujito, Ibaraki (JP); Kazumasa Kiyomi, Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 12/600,352

(22) PCT Filed: May 16, 2008

(86) PCT No.: PCT/JP2008/059018
§ 371 (c)(1),
(2), (4) Date: Nov. 16, 2009

(87) PCT Pub. No.: WO2008/143166
PCT Pub. Date: Nov. 27, 2008

(65) Prior Publication Data
US 2010/0148212 A1    Jun. 17, 2010

(30) Foreign Application Priority Data
May 17, 2007 (JP) ................. 2007-131955

(51) Int. Cl.
*H01L 33/00* (2010.01)
(52) U.S. Cl. ............................... 257/103
(58) Field of Classification Search ............ 257/103
See application file for complete search history.

(56) References Cited

U.S. PATENT DOCUMENTS

| | | | |
|---|---|---|---|
| 7,112,826 B2 | 9/2006 | Motoki et al. | |
| 7,179,667 B2 | 2/2007 | Okagawa et al. | |
| 7,323,256 B2 * | 1/2008 | Xu et al. | 428/698 |
| 7,435,608 B2 * | 10/2008 | Shibata | 438/46 |
| 7,727,332 B2 * | 6/2010 | Habel et al. | 117/88 |
| 7,750,355 B2 * | 7/2010 | Dwilinski et al. | 257/96 |
| 2002/0028564 A1 | 3/2002 | Motoki et al. | |
| 2003/0080345 A1 | 5/2003 | Motoki et al. | |

(Continued)

FOREIGN PATENT DOCUMENTS
EP   1 453 158   9/2004
(Continued)

OTHER PUBLICATIONS

Chakraborty, A. et al., "Demonstration of Nonpolar m-Plane INGaN/GaN Light-Emitting Diodes on Free-Standing m-Plane GaN Substrates", Japanese Journal of Applied Physics, vol. 44, No. 5, pp. L173-L175 (2005).

(Continued)

*Primary Examiner* — David Vu
*Assistant Examiner* — Brandon Fox
(74) *Attorney, Agent, or Firm* — Oblon, Spivak, McClelland, Maier & Neustadt, L.L.P.

(57) ABSTRACT

The method for producing a group III nitride semiconductor crystal of the invention comprises a step of preparing a seed crystal having a non-polar plane followed by growing a group III nitride semiconductor from the non-polar plane in a vapor phase, wherein the growing step includes growing the group III nitride semiconductor so as to extend in the +C-axis direction of the seed crystal. A group III-V nitride semiconductor crystal having high quality and a large-area non-polar plane can be obtained by the method.

13 Claims, 5 Drawing Sheets

U.S. PATENT DOCUMENTS

| | | |
|---|---|---|
| 2004/0048471 A1 | 3/2004 | Okagawa et al. |
| 2004/0251471 A1 | 12/2004 | Dwilinski et al. |
| 2005/0092234 A1* | 5/2005 | Motoki et al. ........... 117/91 |
| 2005/0161697 A1 | 7/2005 | Nakahata et al. |
| 2005/0245095 A1 | 11/2005 | Haskell et al. |
| 2006/0205229 A1* | 9/2006 | Nonaka et al. ........... 438/767 |
| 2006/0273343 A1* | 12/2006 | Nakahata et al. ........ 257/103 |
| 2007/0037308 A1 | 2/2007 | Okuyama et al. |
| 2007/0062440 A1 | 3/2007 | Sato et al. |
| 2007/0126023 A1* | 6/2007 | Haskell et al. ........... 257/103 |
| 2007/0280872 A1 | 12/2007 | Okahisa et al. |
| 2008/0006201 A1 | 1/2008 | Hirota et al. |

FOREIGN PATENT DOCUMENTS

| | | |
|---|---|---|
| JP | 10 335750 | 12/1998 |
| JP | 2002 29897 | 1/2002 |
| JP | 2002-293697 | 10/2002 |
| JP | 2003-218043 | 7/2003 |
| JP | 2004 262755 | 9/2004 |
| JP | 2005 60227 | 3/2005 |
| JP | 2005-145754 | 6/2005 |
| JP | 2006-16294 | 1/2006 |
| JP | 2006 160568 | 6/2006 |
| JP | 2006 169104 | 6/2006 |
| JP | 2006 265101 | 10/2006 |
| JP | 2006-290671 | 10/2006 |
| JP | 2006 315947 | 11/2006 |
| JP | 2006315947 A * | 11/2006 |
| WO | 03 035945 | 5/2003 |
| WO | 2004 053209 | 6/2004 |
| WO | 2004 053210 | 6/2004 |

OTHER PUBLICATIONS

Wang, B. et al., "Ammonothermal Growth of GaN Crystals in Alkaling Solutions", Journal of Crystal Growth, vol. 287, pp. 376-380, (2006).

U.S. Appl. No. 12/920,976, filed Sep. 3, 2010, Fujito, et al.

Extended European Search Report issued Mar. 11, 2011, in European Patent Application No. 08764307.8.

* cited by examiner

METHOD FOR PRODUCING GROUP III NITRIDE SEMICONDUCTOR CRYSTAL, GROUP III NITRIDE SEMICONDUCTOR SUBSTRATE, AND SEMICONDUCTOR LIGHT-EMITTING DEVICE

TECHNICAL FIELD

The present invention relates to a method for producing a group III nitride semiconductor crystal such as GaN (gallium nitride), a group III nitride semiconductor substrate and a semiconductor light-emitting device.

BACKGROUND ART

A group III nitride single crystal such as typically gallium nitride (GaN) is useful as a substance applicable to light-emitting devices such as light-emitting diodes, laser diodes, etc., and high-frequency high-power electronic devices such as HEMT, HBT, etc. Accordingly, it is needed to efficiently produce a group III nitride semiconductor crystal such as GaN or the like of high crystallinity.

For example, a most ideal substrate usable for growth of a GaN crystal thereon is a GaN substrate. However, the nitrogen equilibrium vapor pressure over GaN is extremely high as compared with that over Ga, and therefore, it is difficult to grow a bulk crystal of the compound according to a conventional melt growth method or the like. Accordingly, there is employed a method of producing a GaN crystal, which comprises growing a GaN crystal on a substrate formed of a material differing from GaN, or that is, a substrate formed of a different material (e.g., sapphire substrate, SiC substrate, Si substrate, GaAs substrate, etc.), followed by removing the different material substrate.

At present, the most general GaN substrate is a GaN substrate having a C-plane as the main plane thereof, for which is known a method comprising growing a thick GaN layer having a thickness of at least 300 μm through HVPE (hydride vapor phase epitaxy), then removing the base substrate, followed by slicing and/or polishing the GaN free-standing crystal to give a GaN substrate having a C-plane as the main plane thereof. The main plane means a plane on which a device is formed, or the broadest plane of a structure.

In InGaN-based blue and green LED and LD comprising a GaN substrate in which the C-plane is the surface thereof, there is a problem in that a piezoelectric field forms in the growth axis direction, or that is, in the C-axis direction thereof. The piezoelectric field forms as a result of piezoelectric polarization owing to the crystal structure deformation of the InGaN layer, and the polarization separates the holes and the electrons injected into the light-emitting layer, thereby lowering the probability of recombination that contributes toward light emission. As a result, the internal quantum efficiency lowers, therefore reducing the external quantum efficiency in light-emitting devices. For retarding the influence of the piezoelectric field mentioned above, studies of InGaN-based blue and green LED and LD are being prosperous, in which the non-polar plane referred to as an A-plane or an M-plane that is perpendicular to the C-plane of a GaN crystal is the growth plane thereof (Non-Patent Reference 1).

In that situation, there is increasing a demand for a group III nitride semiconductor substrate such as GaN substrate or the like which has a large area and has good crystallinity, which has a low defect density and has high quality, and which has a surface of a non-polar plane.

Patent Reference 1 discloses a substrate having a plane perpendicular to the C-plane thereof, for example, a (01-10) plane or (11-20) plane as the main plane thereof. However, Patent Reference 1 does not disclose a method for producing substrates.

Patent Reference 2 describes a method comprising growing a crystal on a C-plane in the C-axis direction followed by slicing the crystal along the plane parallel to the growth direction, saying that the dislocation line of the sliced crystal extends in the growth direction.

Patent Reference 3 discloses a technique of aligning plural nitride semiconductor bars each having a C-plane and an M-plane in such a manner that the C-planes could face each other with the M-plane facing up, and growing a nitride semiconductor on the M-plane.

Patent Reference 4 discloses a technique of growing GaN on the A-plane or the M-plane of a seed crystal GaN in a melt followed by further growing GaN in the −C-axis direction.

Patent Reference 1: JP-A 10-335750
Patent Reference 2: JP-A 2002-29897
Patent Reference 3: JP-A 2006-315947
Patent Reference 4: JP-A 2006-160568
Non-Patent Reference 1: 27th Basic Lecture of Thin Film/Surface Physics (issued on Nov. 16, 1998), Society of Applied Physics of Japan, Subcommittee of Thin Film/Surface Physics, p. 75

DISCLOSURE OF THE INVENTION

Problems that the Invention is to Solve

Patent Reference 1 discloses a substrate of which the main plane in a plane perpendicular to the C-plane thereof, but does not disclose a method for producing it. According to the method described in Patent Reference 2, the crystal having grown in the C-axis direction is sliced along the plane parallel to the growth direction, and therefore, the sliced crystals have an extremely large number of dislocation lines parallel to the sliced surface. The substrate having such an extremely large number of dislocation lines is unsuitable for devices. For example, in light-emitting devices such as LED, the substrate is problematic in that the current running through it is ununiform and the light output is ununiform. In order to produce a large-area substrate, an extremely thick crystal must be grown in the C-axis direction. In such a thick crystal, it is difficult to secure the quality uniformity that can be evaluated by the dislocation density. According to the method described in Patent Reference 3, there occurs a defect in the part in which the crystals having grown from the adjacent nitride semiconductor bars associate together. According to the method described in Patent Reference 4, the crystal having grown in the −C-axis direction takes many impurities and is problematic in point of the quality thereof.

The present invention has been made in consideration of the above-mentioned background art, and for example, its objects are to provide an advantageous method for producing a group III nitride semiconductor crystal having high quality and having a large-area non-polar plane, and to provide such a high-quality group III nitride semiconductor crystal and a semiconductor light-emitting device comprising it.

Means for Solving the Problems

One aspect of the invention relates to a method for producing a group III nitride semiconductor crystal, and the production method comprises a growing step of preparing a seed crystal having a non-polar plane and growing a group III nitride semiconductor from the non-polar plane in a vapor phase, and the growing step includes growing the group III nitride semiconductor so as to extend in the +C-axis direction of the seed crystal.

The second aspect of the invention relates to a group III nitride semiconductor having a non-polar plane as the surface thereof, and in the group III nitride semiconductor, the length of the dislocation line detected in observation from the non-polar plane side thereof according to a cathodeluminescence method in the vicinity of the surface of the non-polar plane (for example, in the region within a range to the depth of 200 nm from the surface) is at most 10 μm.

The third aspect of the invention relates to a semiconductor light-emitting device having the group III nitride semiconductor substrate of the second aspect of the invention.

Advantage of the Invention

According to the invention, for example, there is provided an advantageous method for producing a group III nitride semiconductor crystal having high quality and having a large-area non-polar plane. In the group III nitride semiconductor crystal of the invention, there exist no dislocation line parallel to the surface thereof, and the crystal has high quality and is free from a defect as influenced by the crystal morphology of the underlying base structure, and therefore, for example, the crystal is favorable as a substrate for light-emitting device applications.

BEST MODE FOR CARRYING OUT THE INVENTION

In this description, the numerical range expressed by the wording "a number to another number" means the range that falls between the former number indicating the lowermost limit of the range and the latter number indicating the uppermost limit thereof.

In this description, "C-plane" is the (0001) plane in a hexagonal crystal structure (wurtzite crystal structure). In a group III-V compound semiconductor crystal, "C-plane" is a group III plane, and this corresponds to the Ga plane in gallium nitride.

In this description, {10-10} plane is "M-plane", and this is an equivalent plane to the {1-100} plane in a hexagonal crystal structure (wurtzite crystal structure), and this is a non-polar plane and, in general, a cleavage plane. The plane equivalent to the {1-100} plane is (1-100) plane, (−1100) plane, (01-10) plane, (0-110) plane, (10-10) plane, (−1010) plane.

In this description, {11-20} plane is "A-plane", and this is an equivalent plane to the {11-20} plane in a hexagonal crystal structure (wurtzite crystal structure), and this is a non-polar plane. The plane equivalent to the {11-20} plane is (11-20) plane, (−1-120) plane, (1-210) plane, (−12-10) plane, (−2110) plane, (2-1-10) plane.

The production method for the group III nitride semiconductor crystal of a preferred embodiment of the invention comprises a growing step of preparing a seed crystal having a non-polar plane followed by growing a group III nitride semiconductor from the non-polar plane in a vapor phase. The growing step includes growing the group III nitride semiconductor so as to extend in the +C-axis direction (<0001> direction) of the seed crystal. The C-axis direction means the direction falling within a range of directions as inclined by 25° from the C-axis measured at an accuracy within ±0.01°, preferably the direction within a range of directions as inclined by 20°, more preferably the direction within a range of directions as inclined by 10°, even more preferably the direction within a range of directions as inclined by 5°.

Growth of a group III nitride semiconductor brings about dislocation, which extends along with the growth of the crystal. The fact confirmed by the present inventors indicates that, in the growth from the non-polar plane, for example, the dislocation extends mainly in the normal line direction of the non-polar plane but extends little in the vertical direction to the surface. Moreover, in the growth of the group III nitride semiconductor from the non-polar plane of a seed crystal, the group III nitride semiconductor crystal having extended from the non-polar plane toward the +C-axis direction (<0001> direction) contains few dislocations.

The non-polar plane in the invention includes the {10-10} plane and the {11-20} plane in a hexagonal crystal structure, and the {1-10} plane in a cubic crystal structure such as GaAs, etc. Above all, preferred are {10-10} plane and {11-20} plane. For plain explanation in the following description, {10-10} plane or {11-20} plane is taken as an example of the non-polar plane. Accordingly, the {10-10} plane or the {11-20} plane in the following description may be replaced by any other non-polar plane.

Preferably, the seed crystal is selected from the group consisting of sapphire, SiC, ZnO and group III nitride semiconductors. More preferred are group III nitride semiconductors, and most preferred is GaN.

On the seed crystal, preferably, a plane nearly parallel to the {10-10} plane or the {11-20} plane is formed of a group III nitride semiconductor. "Nearly parallel to" as referred to herein is meant to indicate a direction falling within ±0.2° from the parallel direction, preferably within ±0.1°, more preferably within ±0.05°.

A preferred range of the seed crystal is defined herein, and the semiconductor crystal may have a plane inclined from the {10-10} plane or the {11-20} plane of the seed crystal. For example, from the plane inclined by from 5° to 15° from the {10-10} plane toward the A-axis direction (<11-20> axis direction), or from the plane inclined by from 5° to 15° from the {10-10} plane toward the C-axis direction, from the plane inclined by from 5° to 15° from the {11-20} plane toward the M-axis direction (<1-100> axis direction), or from the plane inclined by from 5° to 15° from the {11-20} plane toward the C-axis direction, the crystal may grow in the +C-axis direction. As will be described in more detail hereinunder, the crystal having grown from any plane in the +C-axis direction shall have a plane including {10-10} plane or {11-20} plane.

The seed crystal may have any form so far as it has a flat plane part, preferably containing a straight line at least partly in the peripheral area of the flat plane part thereof. Not specifically defined, the length of the straight line is preferably at least 25 mm, more preferably at least 50 mm, even more preferably at least 75 mm. The straight line as referred to herein is preferably a boundary between the {10-10} plane and the {11-20} plane, more preferably a boundary between the {10-10} plane or the {11-20} plane, and the {0001} plane.

The plane adjacent to the {10-10} plane or the {11-20} plane may be any plane except {0001} plane. Specifically, it is not necessary for the plane to be perpendicular to the {10-10} plane or the {11-20} plane, and the plane may be inclined from the {0001} plane. For example, it may be a semi-polar plane such as {1-102} plane, {11-22} plane, {1-10} plane, {11-2-2} plane.

Preferably, the {10-10} plane or the {11-20} plane is rectangular, and the length of its short side is preferably from 0.1 mm to 5 mm, more preferably from 0.1 mm to 1 mm, even more preferably from 0.1 mm to 0.5 mm. The area of the {10-10} plane or the {11-20} plane is preferably from 2.5 mm² (25 mm×0.1 mm) to 500 mm² (100 mm×5 mm), more preferably from 2.5 mm² (25 mm×0.1 mm) to 100 mm² (100 mm×1 mm), even more preferably from 2.5 mm² (25 mm×0.1 mm) to 50 mm² (100 mm×0.5 mm).

In case where the seed crystal has a {0001} plane, the {0001} plane is preferably square or rectangular. Preferably, the length of its short side is from 1 mm to 20 mm, more preferably from 1 mm to 15 mm, even more preferably from 1 mm to 10 mm. The area of the {0001} plane is preferably from 25 mm² (25 mm×1 mm) to 2000 mm² (100 mm×20 mm), more preferably from 25 mm² (25 mm×1 mm) to 1500 mm² (100 mm×15 mm), even more preferably from 25 mm² (25 mm×1 mm) to 1000 mm² (100 mm×10 mm).

In case where the length of the short side of the (0001) plane is too small and when the crystal grows greatly in the +C-axis direction, the crystal may grow also in any other direction, and in such a case, when the seed crystal is rectangular, the distance between the {10-10} plane and the {11-20} plane thereof facing each other is narrow and therefore, as a result, the crystals having grown in the +C-axis direction may join together. Most preferably, the short side of the (0001) plane is at least 3 mm. When the length of the short side is small, a mask may be formed so as to retard the growth on any of the facing {10-10} plane and {11-20} plane of the seed crystal.

Preferably, the {10-10} plane is a plane having an off angle within a range of ±0.2° relative to the {10-10} plane of the seed crystal as measured at an accuracy within ±0.01°. Preferably, the {11-20} plane is a plane having an off angle within a range of ±0.2° relative to the {11-20} plane of the seed crystal as measured at an accuracy within ±0.01°. More preferably, the off angle is within a range of ±0.1°, even more preferably within a range of ±0.05°.

The seed crystal is prepared by forming a group III nitride semiconductor substrate having a C-plane, and cutting it so that the {10-10} plane or the {11-20} plane of the group III nitride semiconductor substrate is exposed out.

The cutting method includes machining (grinding, cutting) with a file, a grinder, an inner-diameter slicer, a wire saw or the like, polishing by grinding, or dividing by cleavage, etc. Preferably, the {10-10} plane or the {11-20} plane is formed by cleavage. Regarding the method of cleavage, a diamond scriber may be used for notching and splitting, or a laser scriber device may be used. It may be cut directly by hand, or after put on any other bed, it may be broken with a breaking device.

In the growing step, preferably, a group III compound semiconductor is grown according to any of an HVPE method, an MOCVD method or a sublimation method. Of those, most preferred is an HVPE method.

The group III nitride semiconductor preferably has a composition of AlGaN, AlInGaN, AlInGaAs, AlInGaP or AlGaInSb, more preferably a composition of AlGaN, AlInGaN, AlInGaAs or AlInGaP, even more preferably a composition of AlGaN, AlInGaN or AlInGaAs, still more preferably a composition of AlGaN or AlN.

A group III nitride semiconductor having a composition of AlGaN is $Al_{1-x}Ga_xN$ where x is from 0 to 1, preferably x is from 0.5 to 1, more preferably from 0.7 to 1, even more preferably from 0.9 to 1.

The growing step for growing the group III nitride semiconductor having a composition of AlGaN is attained in an atmosphere containing at least GaCl and $NH_3$. The atmosphere preferably contains a carrier gas, for example, $H_2$ and/or $N_2$. The temperature in the growing step is preferably within a range of from 900° C. to 1150° C., more preferably within a range of from 950° C. to 1100° C., even more preferably within a range of from 980° C. to 1070° C. The partial pressure of GaCl is preferably within a range of from $3\times10^1$ Pa to $3\times10^4$ Pa, more preferably within a range of from $3\times10^1$ Pa to $1\times10^4$ Pa, even more preferably within a range of from $3\times10^1$ Pa to $5\times10^3$ Pa. The partial pressure of $NH_3$ is preferably within a range of from $1\times10^3$ to $3\times10^5$ Pa, more preferably within a range of from $1\times10^3$ Pa to $1\times10^5$ Pa, even more preferably within a range of from $1\times10^3$ Pa to $5\times10^4$ Pa. GaCl is formed by reacting Ga and HCl inside or outside the reactor.

The growing step of growing a group III nitride semiconductor having a composition of AlN is attained in an atmosphere containing at least $AlCl_3$ and/or AlCl, and $NH_3$. The atmosphere preferably contains a carrier gas, for example, $H_2$ and/or $N_2$. The temperature in the growing step is preferably within a range of from 1050° C. to 1250° C., more preferably within a range of from 1050° C. to 1200° C., even more preferably within a range of from 1050° C. to 1150° C. The partial pressure of $AlCl_3$ and/or AlCl is preferably within a range of from $3\times10^1$ Pa to $3\times10^4$ Pa, more preferably within a range of from $3\times10^1$ Pa to $1\times10^4$ Pa, even more preferably within a range of from $3\times10^1$ Pa to $5\times10^3$ Pa. The partial pressure of $NH_3$ is preferably within a range of from $1\times10^3$ Pa to $3\times10^5$ Pa, more preferably within a range of from $1\times10^3$ Pa to $1\times10^5$ Pa, even more preferably within a range of from $1\times10^3$ Pa to $5\times10^4$ Pa. $AlCl_3$ and/or AlCl is formed by reacting Al and HCl; and when the temperature is around 600° C. and is relatively low, $AlCl_3$ is mainly formed, but when the temperature is around 800° C. and is relatively high, AlCl is mainly formed.

The seed crystal, and the group III nitride semiconductor growing from the seed crystal are preferably so selected that they are near to each other in point of the lattice constant thereof and that the difference in the thermal expansion coefficient between them is small, from the viewpoint of reducing the defect and the stress to be caused by the difference in the lattice constant and the difference in the thermal expansion coefficient between the two.

Figure 1:
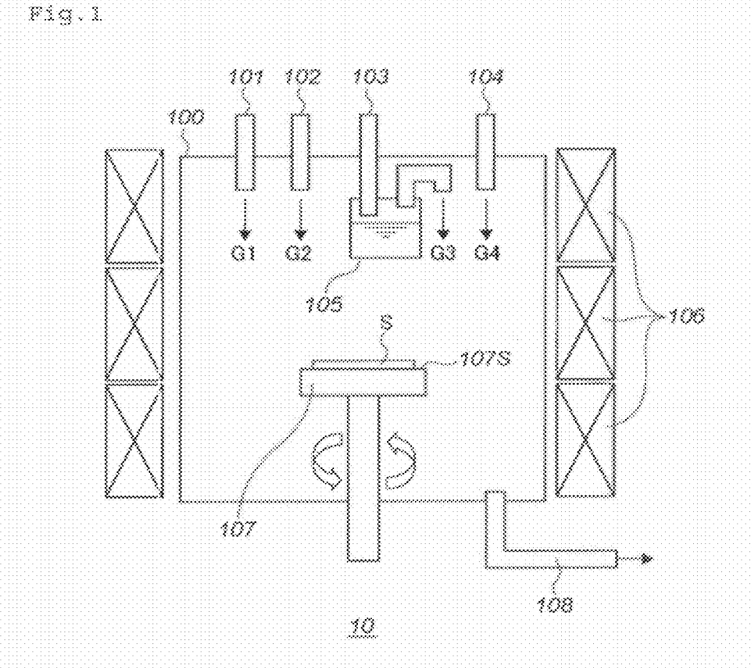
FIG. 1 This is a view showing an outline constitution of an HVPE apparatus favorable for carrying out the growing step in the production method for a group III-V compound semiconductor crystal of a preferred embodiment of the invention.

FIG. 1 is a view showing an outline constitution of an HVPE device favorable for carrying out the growing step in the production method for a group III-IV compound semiconductor crystal in a preferred embodiment of the invention. The HVPE device 10 is provided with a reaction chamber 100, a supporting head 107 for supporting a seed crystal S on the supporting surface 107S thereof as disposed inside the reaction chamber 100, and a heater 106. To the reaction chamber 100, supplied area first carrier gas (e.g., $H_2$) G1, a second carrier gas (e.g., $N_2$) G2, and a group-V material gas (e.g., $NH_3$ gas) G4, through the supply ducts 101, 102 and 104, respectively. To the reserver 105 in the reaction chamber 100, a reaction gas (e.g., HCl) is supplied through the supply duct 103. The reaction gas (e.g., HCl) reacts with a group III material (e.g., Ga) in the reserver 105 to generate a group III material gas (e.g., GaCl gas) G3. In this constitution, the first carrier gas (e.g., $H_2$) G1, the second carrier gas (e.g., $N_2$) G2, the group III material gas (e.g., GaCl gas) G3 and the group-V material gas (e.g., $NH_3$ gas) G4 are applied to the seed crystal S supported by the supporting head 107. The seed crystal S may be so supported that its non-polar plane is nearly parallel to the gas flow, or its non-polar plane is nearly perpendicular to the supporting surface 107S of the supporting head 107. In case where the seed crystal S has a C-plane, the seed crystal S may be so disposed that its C-plane is nearly perpendicular to the gas flow, or its C-plane is nearly parallel to the supporting surface 107S of the supporting head 107. Typically, the seed crystal S may be disposed between the gas supply source side (supply duct and reserver side) and the gas discharge side (exhaust pipe side). The gas inside the reaction chamber 100 is discharged through the exhaust pipe 108. The flow rate of each gas is controlled typically by a mass flow controller (MFC).

A growing step for a group III-V compound semiconductor capable of being carried out using the HVPE device 10 shown in FIG. 1 is described illustratively. The reaction chamber 100 of the HVPE device 10 is heated up to a temperature falling within a range of from 900 to 1150° C. in the presence of $NH_3$, then with feeding a carrier gas G1 $H_2$, a carrier gas G2 $N_2$, a gas G3 GaCl of a reaction product of Ga and HCl, and a gas G4 $NH_3$ to a seed crystal S, GaN single crystal (hereinafter referred to as GaN seed crystal), a GaN crystal is grown from the GaN seed crystal S in a vapor phase. During the growing step, preferably, the pressure for the growth is controlled to be within a range of from $5 \times 10^4$ to $5 \times 10^5$ Pa, the partial pressure of the GaCl gas G3 is within a range of from $3 \times 10^1$ to $3 \times 10^4$ Pa, and the partial pressure of the $NH_3$ gas G4 is within a range of from $1 \times 10^3$ to $3 \times 10^5$ Pa. The feeding speed of the carrier gas is preferably from 0.01 m/min to 10.0 m/min, more preferably from 0.05 m/min to 0.6 m/min, even more preferably from 0.1 m/min to 3.0 m/min. One of the carrier gas G1 or G2 may not be used. After the growing step, the reaction chamber 100 was cooled to room temperature. As the GaN seed crystal S, preferred is one having a non-polar plane of {10-10} plane or {11-20} plane.

In the growing step, a GaN crystal grows from the non-polar plane. The GaN crystal grows from the non-polar plane of the GaN seed crystal S mainly in the normal line direction thereof, and thereafter grows to extend in the +C-axis direction (<0001> direction) of the GaN seed crystal S. The growing GaN crystal forms a plane nearly parallel to the non-polar plane of the GaN seed crystal. "Nearly parallel" as referred to herein is meant to indicate the direction within ±0.2° from the parallel direction, preferably the direction within ±0.1°, more preferably the direction within ±0.05°.

All the planes of the GaN crystal having grown from the {10-10} plane or the {11-20} plane of the seed crystal could not be flat. In case where the {10-10} plane or the {11-20} plane of the seed crystal is formed to fall within the above-mentioned preferred range, the grown GaN crystal may form a plane nearly parallel to the {10-10} plane or the {11-20} plane. However, the plane of the GaN crystal having grown from a plane inclined from the {10-10} plane or the {11-20} plane of the seed crystal could be partly a {10-10} plane or a {11-20} plane, but has a step in the same direction as the inclined direction of the {10-10} plane or the {11-20} plane of the seed crystal, and all these steps form a {10-10} plane or a {11-20} plane. When the inclination from the {10-10} plane or the {11-20} plane is small, then the area of the step is large; but when the inclination is large, then the area is small.

To that effect, the GaN crystal having grown from the plane inclined from the {10-10} plane or the {11-20} plane of the seed crystal may be applied to various methods where the crystal is cut to produce various inclined {10-10} planes or {11-20} planes.

The ratio of the growth level in the +C-axis direction to the growth level in the other direction (+C-axis direction/other direction) may be generally from 10 to 100, preferably from 15 to 50, more preferably from 20 to 40. The growth level in the +C-axis direction may be determined by measuring the length of the growth in the +C-axis direction. The growth level in the other direction than the C-axis direction (for example, in the M-axis direction) may be determined by measuring the length of the growth in that direction from the growth start plane in the obtained crystal.

The grown GaN crystal may be a single crystal that inherits the crystal structure of the GaN seed crystal S.

The supporting head 107 disposed in the reaction chamber 100 preferably has, for example, an SiC surface, and for example, it may be formed of a carbon member coated with SiC. Preferably, the supporting head 107 does not have a part that may disturb the gas flow on the upstream side of the growing group III-V compound semiconductor crystal. When the head has a part that disturb the gas flow on the upstream side, then a crystal such as polycrystal or the like may grow on the part in the growing step, and during the growth of the reaction product, for example, GaN, HCl gas may be generated to have some negative influence on the obtained crystal. Preferably, the supporting head 107 has a same size as that of the seed crystal, or has a size that could be screened by the seed crystal, as seen from the upstream side of the gas flow.

The production method for a group III nitride semiconductor crystal in a preferred embodiment of the invention may further comprises separating the group III nitride semiconductor having grown in the previous growing step, from the seed crystal. The separating method includes, for example, cutting or slicing, but preferred is slicing.

Of the group III nitride semiconductor crystal, at least the part having grown on the surface of the seed crystal contains more dislocations running through it from the surface, as compared with the crystal having grown from the edge of the seed crystal; and therefore, this part is preferably removed. The removing method includes, for example, cutting or slicing, but preferred is slicing. The slicing method may be, for example, in any mode of wire slicing or inner-diameter slicing.

The surface of the sliced crystal is roughened by the slicing blade, and therefore, in order to use the crystal for a semiconductor substrate, the crystal requires a polishing step. The polishing method is preferably lapping with a diamond slurry, and CMP.

For evaluating the substrate as finished after the separating step and the polishing step, the surface of the crystal polished in the polishing step is checked for the dislocations existing therein. The method for detecting the dislocations in the finished group III nitride semiconductor crystal includes a transmission electromicroscopy method (hereinafter referred to as TEM method), a cathodeluminescence method (hereinafter referred to as CL method), a method of analyzing etched surface pits with AFM, optical microscope, or the like, etc. Depending on the methods, the detectable field of vision differs. The TEM method is applicable to a case where the dislocation density is essentially at least $5 \times 10^6/cm^2$; the CL method is to a case where the dislocation density is to a case where the dislocation density is essentially at least $1 \times 10^5/cm^2$; and the method of analyzing etched surface pits with AFM, optical microscope, or the like is to a case where the dislocation density is essentially from $1 \times 10^6$ to $1 \times 10^3/cm^2$. According to the production method of the invention, it is possible to produce a group III nitride semiconductor in which the length of the dislocation lines detectable in the surface of the main plane (having a broadest area) is at most 10 μm. Preferably, the length of the dislocation lines is at most 10 μm, more preferably at most 5 μm, even more preferably at most 1 μm. For example, when a group III nitride semiconductor having a {10-10} plane or a {11-20} plane is produced according to the production method of the invention, it is confirmed that, in the vicinity to the surface of the {10-10} plane or the {11-20} plane (in the region within a range to a depth of 200 nm from the surface), the length of the dislocation lines detected in observation from the side of the {10-10} plane or the {11-20} plane according to a cathodeluminescence method is at most 10 μm.

In the cathodeluminescence method, not only the dislocations in the crystal surface but also the dislocations in the inside of the crystal to a depth of a few 100 nm from the surface can be detected. On the other hand, in analyzing etched surface pits, only the dislocations existing in the surface are detected. Non-Patent Reference 1 shows the following experiential formula that indicates the depth of the information obtainable in a CL method:

$$Re = (2.76 \times 10^{-2} A/\rho Z^{0.889}) E^{1.67}$$

wherein Re means the penetration length [μm] of the electron coming in the bulk crystal; ρ means the density [g/cm³] of the substance; E means the energy [keV] of the incident electron; A means the number of mass [g/mol]; and Z means the atomic number.

According to the formula, for example, GaN is analyzed to have dislocations up to around 200 nm from the surface when analyzed at an acceleration voltage of 5 kV, and dislocations up to around 100 nm at an acceleration voltage of 3 kV.

In the production method of a preferred embodiment of the invention, the size of the group III nitride semiconductor is determined by the length of the straight line in the peripheral part of the seed crystal having a {10-10} plane or a {11-20} plane, and the thickness of the growth extending in the +C-axis direction (<0001> direction). Accordingly, the growing speed in the +C-axis direction (<0001> direction) is preferably higher; and concretely, the growing speed is preferably at least 100 μm/hr, more preferably 200 μm/hr, even more preferably at least 300 μm/hr. During the growth, the growing region concentrates in the peripheral part of the seed crystal, and therefore the growth is characterized in that the growing speed is higher than in a case where the growing region covers the entire surface. Accordingly, the area of the {10-10} plane or the {11-20} plane is preferably at least 1 cm², more preferably at least 2 cm², even more preferably at least 5 cm².

The thickness of the group III nitride semiconductor to be produced according to the production method of the invention may be generally from 0.1 mm to 1 mm, preferably from 0.2 mm to 0.8 mm, more preferably from 0.3 mm to 0.5 mm. For example, according to the production method of the invention, it is possible to produce a group III nitride semiconductor substrate having an area of the {10-10} plane or the {11-20} plane thereof of at least 1 cm² and having a thickness of from 0.3 mm to 0.5 mm, and more preferably, it is possible to produce a group III nitride semiconductor substrate having an area of the {10-10} plane or the {11-20} plane thereof of at least 2 cm² and having a thickness of from 0.3 mm to 0.5 mm, A radius of curvature is taken as on index of evaluating a crystal. The radius of curvature indicates the curving degree of the crystal plane of a substrate. The radius of curvature may be determined through X-ray diffractiometry (hereinafter XRD). At two points spaced by a distance ΔX on the surface of a substrate, the sample is analyzed for ω-scanning (locking curve) in the plane parallel to the substrate plane, thereby obtaining the respective ω angles, ω1 and ω2. From ΔX, ω1 and ω2, the radius of curvature R of the crystal plane is computed according to the following formula:

$$R = \Delta X/(\omega 1 - \omega 2).$$

According to the production method of the invention, a group III nitride semiconductor substrate can be produced, of which the radius of curvature of the crystal plane as measured through XRD is at least 15 m. Preferably, the radius of curvature is from 15 m to 1000 m, more preferably from 15 m to 500 m, even more preferably from 15 m to 100 m.

The group III nitride semiconductor substrate produced according to the production method of the invention is preferably $Al_{1-x}Ga_xN$ ($0 \leq x \leq 1$), preferably having a non-polar plane of at least {10-10} plane or {11-20} plane.

The device to be formed on the group III nitride semiconductor substrate produced according to the production method of the invention is not specifically defined. The substrate is favorable for applications to light-emitting devices and electronic devices. For these devices, the substrate has the advantages in that it has few dislocation lines, it warps little and it may have a large area. In use in light-emitting devices, the substrate is free from a trouble of wavelength shifting in large current introduction, and the devices comprising the substrate are favorably driven in a whole wavelength region. From the viewpoint of internal quantum efficiency, the emission wavelength is not specifically defined. Preferably, however, the emission wavelength is at least 380 nm, more preferably at least 440 nm, even more preferably at least 500 nm. A light-emitting device formed on an ordinary polar plane substrate may be troubled by internal quantum efficiency depression when the emission wavelength is long, owing to the influence of the inner electric field thereon. On the other hand, the influence of the inner electric field on the light-emitting device formed on the group III nitride semiconductor substrate produced according to the production method of the invention may be ignored, and therefore even devices designed for a longer wavelength of 440 nm or more are expected to enjoy a good internal quantum efficiency. From the practicable viewpoint, the advantages of the invention are more remarkable in light-emitting devices having an emission wavelength of 500 nm or more.

EXAMPLES

Some Examples and Comparative Examples of the invention are shown below. In the following Examples and Comparative Examples, the HVPE device 10 shown in FIG. 1 was used. Comparative Examples are shown below not for the purpose of restricting the scope of the present invention but for the purpose of providing Comparative Examples inferior to better Examples.

Example 1

Figure 2:
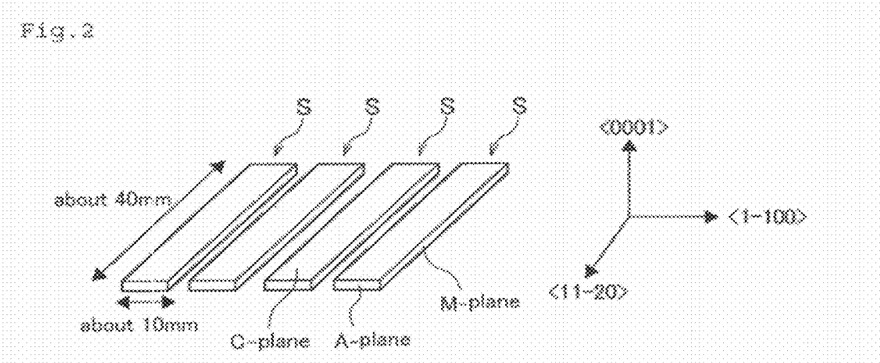
FIG. 2 This is a view showing one example of a seed crystal.

As seed crystal S, four bar-shaped free-standing GaN substrates graphically shown in FIG. 2 (hereinafter referred to as GaN seed crystal) were prepared. The GaN seed crystal S is a rectangular body designed as follows: Its periphery is formed of a straight line, the {0001} plane (that is, the C-plane) is the main plane, the M-plane is the long side plane, and the A-plane is the short side plane. The long side plane is planed by cleavage. Regarding the size, the long side is about 40 mm, the short side is about 10 mm, and the thickness is about 400 μm.

Figure 3:
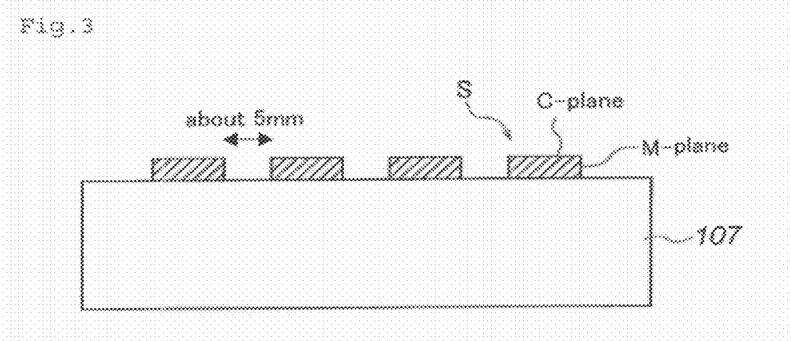
FIG. 3 This is a view showing an example of a disposition of seed crystals in a reaction chamber.

As the supporting head 107 in the HVPE device 10 shown in FIG. 1, employed was an SiC-coated carbon-made supporting head having a diameter of 80 mm and a thickness of 20 mm. As illustrated in FIG. 3, four GaN seed crystals S were put on the supporting head 107 as spaced from each other by an interval of about 5 mm, and processed for a growing step of GaN crystal thereon, as follows:

The reaction chamber 100 in the HVPE device 10 was heated up to 1040° C., and then with feeding a carrier gas G1 $H_2$, a carrier gas G2 $N_2$, a gas G3 GaCl of a reaction product of Ga and HCl, and a gas G4 $NH_3$ to the GaN single crystal as the seed crystal S (hereinafter referred to as GaN seed crystal), a GaN crystal was grown from the GaN seed crystal S for 50 hours in a vapor phase. During the growing step, the pressure for the growth was $1.01 \times 10^5$ Pa, the partial pressure of the GaCl gas G3 was $3.07 \times 10^2$ Pa, and the partial pressure of the NH$_3$ gas G4 was $1.27 \times 10^4$ Pa. After the growing step, the reaction chamber 100 was cooled to room temperature. Accordingly, a GaN crystal structure was obtained, as graphically shown in FIG. 4

Figure 4:
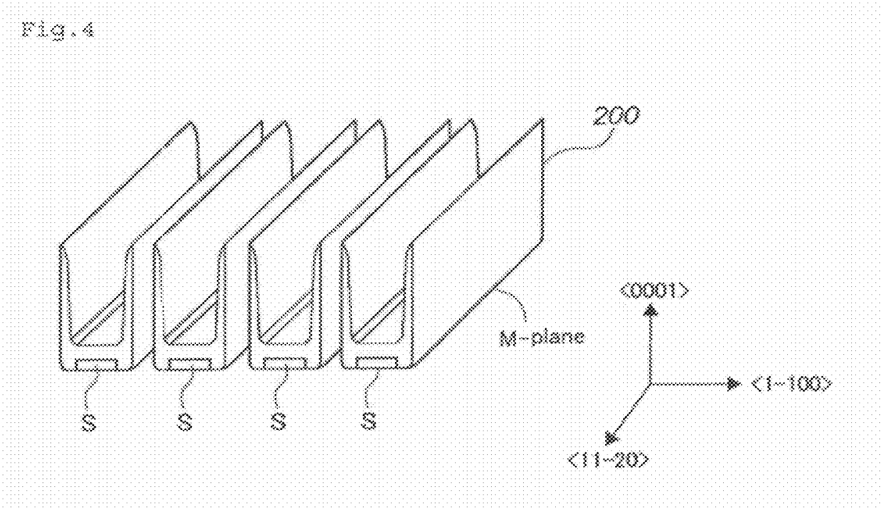
FIG. 4 This is a view schematically showing a structure of a GaN crystal obtained in a growing step.

The GaN crystal 200 obtained in the growing step has a wall part extending from the M-plane of the GaN seed crystal S in the +C-axis direction (<0001> direction) thereof. Cutting out from the wall part gave a rectangular bulk crystal having the M-plane as the main plane thereof. Regarding the size of the bulk crystal, the long side direction was about 40 mm, the short side direction was 32 mm and the thickness was about 2.5 mm. The bulk crystal was cut, sliced and polished to give plural M-plane free-standing substrates having a size of 20 mm×30 mm×400 μm.

Figure 5:
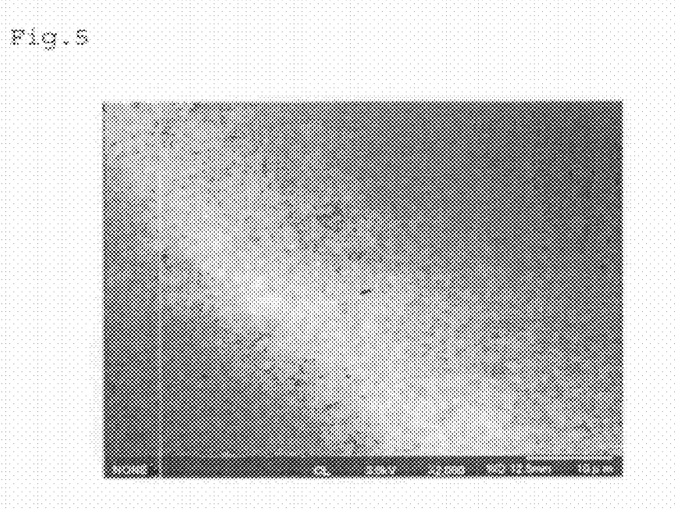
FIG. 5 This is a CL (cathodeluminescence) image of an M-plane free-standing substrate obtained through a growing step.

FIG. 5 is a CL (cathodeluminescence) image observed from the M-plane side of the M-plane free-standing substrate, as obtained through the growing step, at an acceleration voltage of 3 kV and at a 2000-power magnification. The CL image was analyzed, in which no dislocation lines longer than 10 μm were detected at all.

The test condition in the Cl method used in this Example is as follows: The acceleration voltage is 3 kV, the microscope used has a 2000-power magnification, and the field of vision is $2.7 \times 10^3$ μm$^2$.

The test condition in XRD used in this Example is as follows: The X-ray source is CuKα ray source, the collimator diameter on the light coming-in side is 1.0 mmφ, the slit width on the detector side is 0.5 deg., and ΔX is from 10 mm to 20 mm. When the substrate surface is {10-10} plane, the two points spaced from each other are taken in two directions parallel to the <0001> axis direction and the <11-20> axis direction; and when the substrate surface is {11-20} plane, the spaced two points are taken in two directions parallel to the <0001> axis direction and the <1-100> axis direction. Based on the found data, the radius of curvature in each direction was computed.

The radius of curvature of the thus-obtained M-plane free-standing substrate was computed, and it was 18.2 m in the <0001> direction and was 20.5 m in the <11-20> direction.

Example 2

As seed crystal S, four bar-shaped free-standing GaN substrates (hereinafter referred to as GaN seed crystal) were prepared. The GaN seed crystal S is a rectangular body designed as follows: The (0001) plane (that is, the C-plane) is the main plane, the plane inclined by 0.2° in the A-axis direction relative to the M-plane is the long side plane, and the A-plane is the short side plane. Regarding the size, the long side is about 40 mm, the short side is about 10 mm, and the thickness is about 400 μm.

The supporting of the GaN seed crystal S by the supporting head 107, and the temperature, the gas partial pressure and the growing time in the growing step for GaN crystal were the same as in Example 1. After the growing step for GaN crystal, the system was cooled to room temperature to give a GaN crystal.

Like in Example 1, the structure of the obtained GaN crystal had a wall part, as graphically shown in FIG. 4. Cutting out from the wall part gave a rectangular bulk crystal having the M-plane as the main plane thereof. Regarding the size of the bulk crystal, the long side direction was about 40 mm, the short side direction was 32 mm and the thickness was about 2.5 mm. The bulk crystal was cut, sliced and polished to give plural M-plane free-standing substrates having a size of 20 mm×30 mm×400 μm.

The CL (cathodeluminescence) image observed from the M-plane side of the M-plane free-standing substrate obtained herein, at an acceleration voltage of 3 kV and at a 2000-power magnification was almost the same image as that of the crystal obtained in Example 1, in which no dislocation lines longer than 10 μm were detected at all. The radius of curvature of the thus-obtained M-plane free-standing substrate was computed, and it was 17.5 m in the <0001> direction and was 20.2 m in the <11-20> direction.

Example 3

As seed crystal S, four bar-shaped free-standing GaN substrates (hereinafter referred to as GaN seed crystal) were prepared. The GaN seed crystal S is a rectangular body designed as follows: The (0001) plane (that is, the C-plane) is the main plane, the plane inclined by 0.4° in the A-axis direction relative to the M-plane is the long side plane, and the A-plane is the short side plane.

The supporting of the GaN seed crystal S by the supporting head 107, and the temperature, the gas partial pressure and the growing time in the growing step for GaN crystal were the same as in Example 1. After the growing step for GaN crystal, the system was cooled to room temperature to give a GaN crystal.

Figure 9:
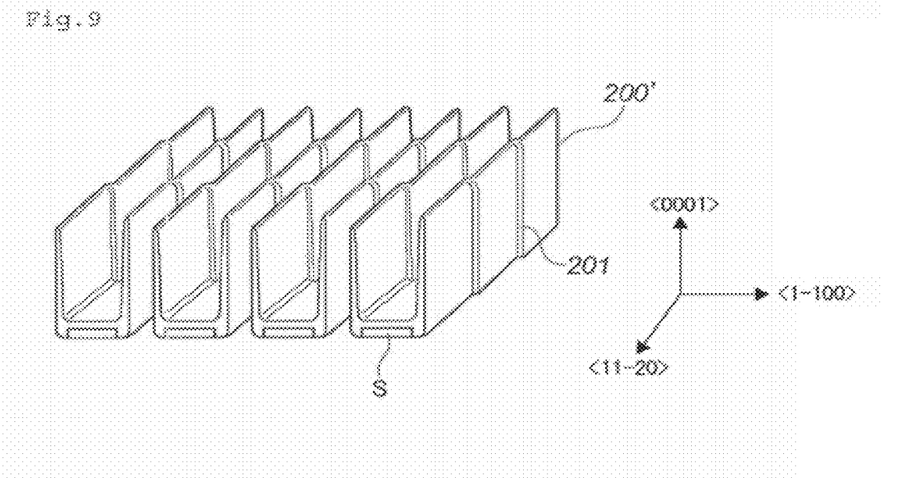
FIG. 9 This is a view graphically showing a structure of a GaN crystal obtained in a growing step.

As graphically shown in FIG. 9, the GaN crystal 200' obtained in the above-mentioned growing step is the same as in Examples 1 and 2 in that it has a wall part extending from the M-plane of the GaN seed crystal S in the +C-axis direction (<0001> direction) thereof. However, in Example 3, the wall part had steps 201 formed at intervals of about 15 mm.

Example 4

As seed crystal S, four bar-shaped free-standing GaN substrates graphically shown in FIG. 2 (hereinafter referred to as GaN seed crystal) were prepared. The GaN seed crystal S is a rectangular body designed as follows: Its periphery is formed of a straight line, the {0001} plane (that is, the C-plane) is the main plane, the plane inclined by 2° in the A-axis direction relative to the M-plane is the long side plane, and the A-plane is the short side plane. The long side plane is planed by cutting with a laser scriber. Regarding the size, the long side is about 40 mm, the short side is about 10 mm, and the thickness is about 400 μm.

Using the GaN seed crystal, a crystal was grown under the same condition as in Example 1. As a result, a GaN crystal structure as graphically shown in FIG. 9 was obtained.

The GaN crystal 200' obtained in the growing step has a wall part extending from the M-plane of the GaN seed crystal S in the +C-axis direction (<0001> direction) thereof. Cutting out from the wall part gave a rectangular bulk crystal having the M-plane as the main plane thereof. Regarding the size of the bulk crystal, the long side direction was about 40 mm, the short side direction was 22 mm and the thickness was about 2.3 mm. The bulk crystal was cut, sliced and polished to give plural M-plane free-standing substrates inclined by 2 degrees in the A-axis direction and having a size of 15 mm×30 mm×400 μm.

Example 5

Figure 6:
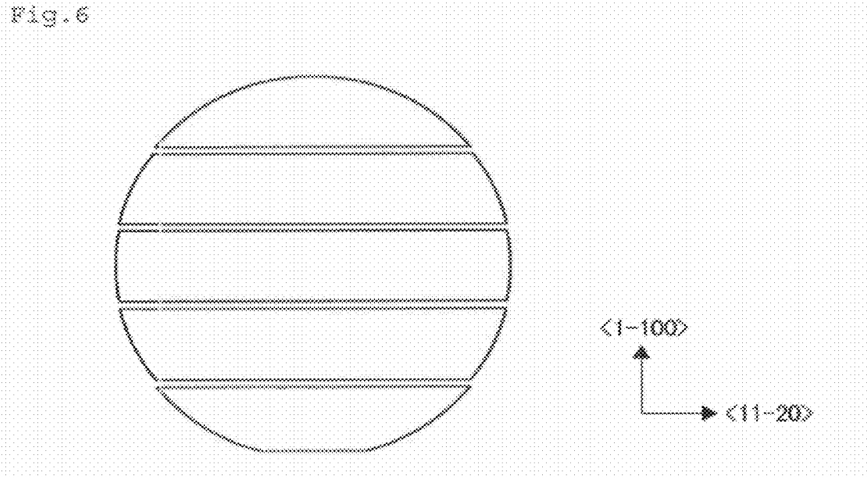
FIG. 6 This is a view showing one example of a seed crystal.

A template substrate was prepared by growing a GaN layer having a surface of a (0001) plane to a thickness of 4 μm, on a sapphire substrate having a (0001) plane (that is, C-plane) as the main plane and having a thickness of 430 μm and a diameter of 2 inches, in an MOCVD device. Next, using a diamond scriber, the back sapphire side was cleaved by notching it in the direction parallel to the M-plane of GaN at intervals of about 10 mm, thereby producing bar-shaped GaN template substrates having a width of about 10 mm as GaN seed crystal S, as graphically shown in FIG. 6.

The supporting of the GaN seed crystal S by the supporting head 107, and the temperature, the gas partial pressure and the growing time in the growing step for GaN crystal were the same as in Example 1. After the growing step for GaN crystal, the system was cooled to room temperature to give a GaN crystal.

Like in Example 1, the thus-obtained GaN crystal structure had a wall part extending from the M-plane thereof. Cutting out from the wall part gave a rectangular bulk crystal having the M-plane as the main plane thereof. The length of the bulk crystal in the long side direction varies depending on the length of the underlying bar-shaped GaN seed crystal S, and was at most about 50 mm. The length of the bulk crystal in the short side direction was 35 mm, and the thickness thereof was about 2 mm. The bulk crystal was cut, sliced and polished to give plural M-plane free-standing substrates having a size of 20 mm×33 mm×400 μm.

The CL (cathodeluminescence) image observed from the M-plane side of the M-plane free-standing substrate obtained herein, at an acceleration voltage of 5 kV and at a 2000-power magnification was almost the same image as that of the crystal obtained in Example 1, in which no dislocation lines longer than 10 μm were detected at all. The radius of curvature of the thus-obtained M-plane free-standing substrate was computed, and it was 17.8 m in the <0001> direction and was 19.6 m in the <11-20> direction.

Example 6

Figure 7:
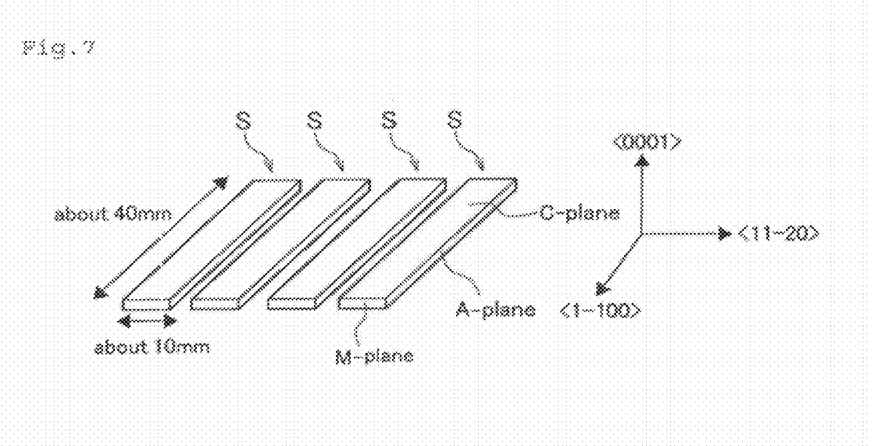
FIG. 7 This is a view showing one example of a seed crystal.

As seed crystal S, four bar-shaped free-standing GaN substrates graphically shown in FIG. 7 (hereinafter referred to as GaN seed crystal) were prepared. The GaN seed crystal S is a rectangular body designed as follows: The (0001) plane (that is, the C-plane) is the main plane, the plane inclined by ±2° in the M-axis direction relative to the A-plane as measured at an accuracy falling within ±0.01° is the long side plane, and the M-plane is the short side plane. Every plane is planed by cutting and polishing. Regarding the size, the long side is about 40 mm, the short side is about 10 mm, and the thickness is about 400 μm.

As the supporting head 107 in the HVPE device 10 shown in FIG. 1, employed was an SiC-coated carbon-made supporting head having a diameter of 80 mm and a thickness of 20 mm. Four GaN seed crystals S were put on the supporting head 107 as spaced from each other by an interval of about 5 mm, and processed for a growing step of GaN crystal thereon, as follows:

The temperature, the gas partial pressure and the growing time in the growing step for GaN crystal were the same as in Example 1. After the growing step for GaN crystal, the system was cooled to room temperature. Accordingly, a GaN crystal structure as graphically shown in FIG. 8 was obtained.

Figure 8:
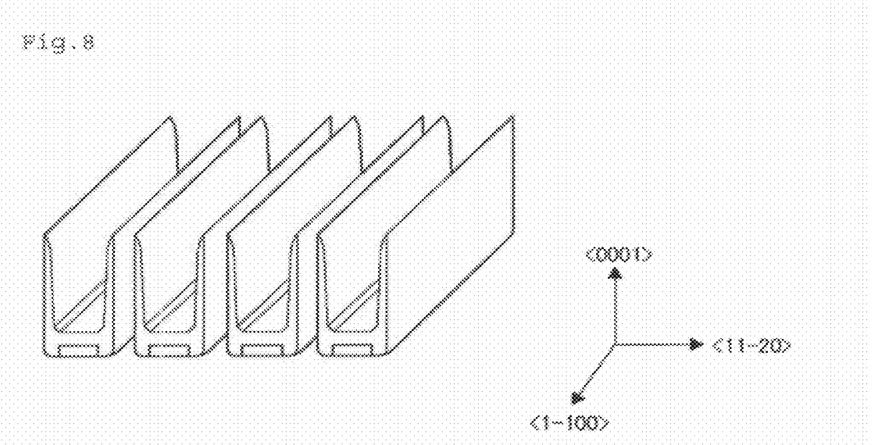
FIG. 8 This is a view graphically showing a structure of a GaN crystal obtained in a growing step.

The GaN crystal 200 obtained in the growing step has a wall part extending from the M-plane of the GaN seed crystal S in the +C-axis direction (<0001> direction) thereof. Cutting out from the wall part gave a rectangular bulk crystal having the A-plane as the main plane thereof. Regarding the size of the bulk crystal, the long side direction was about 40 mm, the short side direction was 32 mm and the thickness was about 2.0 mm. The bulk crystal was cut, sliced and polished to give plural A-plane free-standing substrates having a size of 20 mm×30 mm×400 μm.

The CL (cathodeluminescence) image observed from the A-plane side of the A-plane free-standing substrate obtained herein, at an acceleration voltage of 3 kV and at a 2000-power magnification was almost the same image as that of the crystal obtained in Example 1, in which no dislocation lines longer than 10 μm were detected at all. The radius of curvature of the thus-obtained A-plane free-standing substrate was computed, and it was 19.8 m in the <0001> direction and was 20.6 m in the <1-100> direction.

Example 7

As seed crystal S, four bar-shaped SiC substrates (SiC seed crystal) were prepared. The SiC seed crystal S is a rectangular body designed as follows: The (0001) plane (that is, the C-plane) is the main plane, the M-plane is the long side plane, and the A-plane is the short side plane. The long side plane is planed by cleavage. Regarding the size, the long side is about 40 mm, the short side is about 13 mm, and the thickness is about 330 μm.

As the supporting head 107 in the HVPE device 10 shown in FIG. 1, employed was PBN-coated carbon-made supporting head having a diameter of 80 mm and a thickness of 20 mm. The reaction chamber in the HVPE device 10 was heated up to 1150° C., and then with feeding a carrier gas G1 $H_2$, a gas G3 $AlCl_3$ of a reaction product of Al and HCl, and a gas G4 $NH_3$ to the SiC seed crystal, an AlN crystal was grown for 40 hours in a vapor phase. During the growing step, the pressure for the growth was $9.5 \times 10^4$ Pa, the partial pressure of the $AlCl_3$ gas G3 was $2.82 \times 10^2$ Pa, and the partial pressure of the $NH_3$ gas G4 was $1.03 \times 10^4$ Pa. After the growing step, the reaction chamber 100 was cooled to room temperature. Accordingly, an AlN crystal structure was obtained, as graphically shown in FIG. 4.

The AlN crystal thus obtained had a wall part, as graphically shown in FIG. 8. Cutting out from the wall part gave a rectangular bulk crystal having the M-plane as the main plane thereof. Regarding the size of the bulk crystal, the long side direction was about 40 mm, the short side direction was 15 mm and the thickness was about 1.2 mm. The bulk crystal was cut, sliced and polished to give plural A-plane free-standing substrates having a size of 40 mm×13 mm×300 μm.

The CL (cathodeluminescence) image observed from the M-plane side of the M-plane free-standing AlN substrate obtained herein, at an acceleration voltage of 3 kV and at a 2000-power magnification was almost the same image as that of the crystal obtained in Example 1, in which no dislocation lines longer than 10 μm were detected at all. The radius of curvature of the thus-obtained M-plane free-standing AlN substrate was computed, and it was 22.8 m in the <0001> direction and was 23.6 m in the <11-20> direction.

Example 8

As seed crystal S, four bar-shaped free-standing GaN substrates (hereinafter referred to as GaN seed crystal) were prepared. The GaN seed crystal S is a rectangular body designed as follows: The (0001) plane (that is, the C-plane) is the main plane, the plane inclined by 0.4° in the M-axis direction relative to the A-plane is the long side plane, and the M-plane is the short side plane. Regarding the size of the crystal, the long side thereof is about 40 mm, the short side is about 10 mm and the thickness is about 400 μm.

The supporting of the GaN seed crystal S by the supporting head 107, and the temperature, the gas partial pressure and the growing time in the growing step for GaN crystal were the same as in Example 1. After the growing step for GaN crystal, the system was cooled to room temperature to give a GaN crystal.

The GaN crystal obtained in the growing step is the same as in Examples 6 and 7 in that it has a wall part extending from the M-plane of the GaN seed crystal S in the +C-axis direction (<0001> direction) thereof. However, in Example 8, the wall part had steps 201 formed therein.

Example 9

Just like in Example 1, four bar-shaped GaN seed crystals were set on the supporting head 107 in the HVPE device 10 shown in FIG. 1, as spaced from each other by about 5 mm. Next, a GaN crystal was grown on it in the manner mentioned below.

The reaction chamber 100 in the HVPE device 10 was heated up to 1050° C., and then with feeding a carrier gas G1 $H_2$, a carrier gas G2 $N_2$, a gas G3 GaCl of a reaction product of Ga and HCl, and a gas G4 $NH_3$ to the GaN single crystal as the seed crystal S (hereinafter GaN seed crystal), a GaN crystal was grown from the GaN seed crystal S for 50 hours in a vapor phase. During the growing step, the pressure for the growth was $1.01 \times 10^5$ Pa, the partial pressure of the GaCl gas G3 was $1.26 \times 10^2$ Pa, and the partial pressure of the $NH_3$ gas G4 was $9.26 \times 10^3$ Pa. After the growing step, the reaction chamber 100 was cooled to room temperature. Accordingly, a GaN crystal structure was obtained, as graphically shown in FIG. 4. With increasing the ratio of $NH_3$/GaCl, the polycrystal adhering to the seed crystal decreased.

The GaN crystal 200 thus obtained in the growing step has a wall part extending from the M-plane of the GaN seed crystal S in the +C-axis direction (<0001> direction) thereof. Cutting out from the wall part gave a rectangular bulk crystal having the M-plane as the main plane thereof. Regarding the size of the bulk crystal, the long side direction was about 40 mm, the short side direction was 32 mm and the thickness was about 2.3 mm. The bulk crystal was cut, sliced and polished to give plural M-plane free-standing substrates having a size of 20 mm×30 mm×400 μm.

The CL image of the obtained crystal on the M-plane side thereof was observed under the same condition as in Example 1, and no dislocation lines longer than 10 μm were detected at all therein.

Comparative Example 1

As seed crystal S, a circular free-standing GaN substrate having a (0001) plane (that is, C-plane) as the main plane and having a diameter of 2 inches and a thickness of 400 μm was prepared. This seed crystal S is a circular wafer, not having a cleaved plane or a polished plane of an M-plane or an A-plane.

As the supporting head 107 in the HVPE device 10 shown in FIG. 1, employed was an SiC-coated carbon-made supporting head having a diameter of 80 mm and a thickness of 20 mm, and the GaN seed substrate S was disposed on the supporting head 107. The temperature, the gas partial pressure and the growing time in the growing step for GaN crystal were the same as in Example 1. After the growing step for GaN crystal, the reaction chamber was cooled to room temperature.

A circular wall-like crystal adhered to the periphery of the GaN seed substrate to a height of from about 10 mm to 20 mm or so. On the C-plane, a GaN crystal grew to a height of about 8 mm, but its surface had many pits.

Working the wall-like polycrystal having adhered to the periphery of the GaN seed crystal S was tried by slicing, cleaving or the like to give a free-standing substrate; however, since the grown crystal was ring-like, it was broken into pieces, and could not form a tabular substrate.

The GaN crystal having grown on the C-plane was cut, sliced and polished to give plural M-plane free-standing substrate having a size of 20 mm×80 mm×400 μm.

Figure 10:
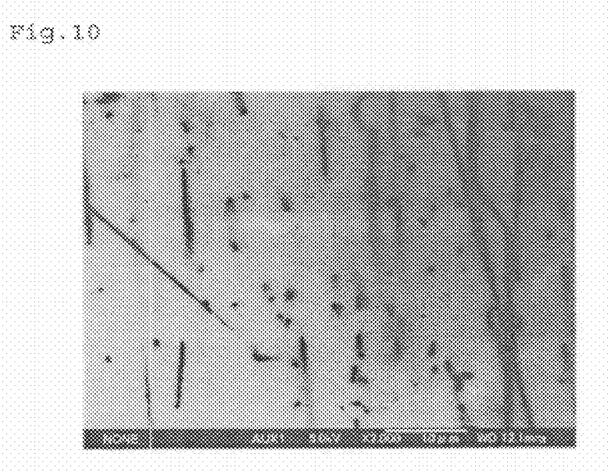
FIG. 10 This is a CL (cathodeluminescence) image of an M-plane free-standing substrate obtained through a growing step.

FIG. 10 is a CL (cathodeluminescence) image observed from the M-plane side of the M-plane free-standing substrate obtained through the growing step, at an acceleration voltage of 5 kV and at a 2000-power magnification. The CL image was analyzed, in which streaky dislocation lines having a length of 10 μm or more and parallel to the <0001> axis direction, dislocation lines running obliquely, and dark spots were detected. The dark spot density is difficult to compute; however, one dislocation line was considered as one spot, and the dark spot density was $2.5 \times 10^6$ ($cm^{-2}$). The radius of curvature of the obtained M-plane free-standing substrate was computed, and was 11.0 m in the <0001> direction, and 4.7 m in the <11-20> direction.

Comparative Example 2

As seed crystal S, GaN was grown to a thickness of 4 μm on a sapphire substrate having a (0001) plane (that is, C-plane) as the main plane thereof, according to an MOCVD method, and a mask pattern (line-and-space pattern) of an SiNx film was formed on it. In the mask pattern, the opening part (space part) has a width of 3 μm and the mask part (line part) has a width of 27 μm. Next, from the GaN layer exposed out in the opening part, a GaN crystal was grown through ELO (epitaxial lateral overgrowth) according to an MOCVD method. The mask part (line part) extends in parallel to the <1-100> axis. The growing condition was so controlled that the cross-sectional profile of the GaN crystal to be formed could be rectangular. The crystal growth was stopped so that the adjacent crystals could not associate on the mask part of an SiNx film through the lateral growth thereof. After the lateral growth was stopped, A-plane was exposed outside as the side plane of the crystal. In that manner, a GaN seed crystal S was produced.

The GaN seed crystal S had (0001) plane (that is, C-plane) as the main plane thereof, and has A-plane as the long side plane thereof. Regarding the size, the long side is from 20 mm to 45 mm, but the width is about 20 μm and is small. The thickness of the GaN layer to be grown through ELO is about 10 μm or so.

The supporting of the GaN seed crystal S by the supporting head 107, and the temperature, the gas partial pressure and the growing time in the growing step for GaN crystal were the same as in Example 1. After the growing step for GaN crystal, the system was cooled to room temperature to give a GaN crystal.

In this Comparative Example 2, no growth occurred from the side plane part of the GaN seed crystal S, but the side plane was buried in C-plane, not growing like a wall.

The invention claimed is:

1. A method for producing a group III nitride semiconductor crystal, comprising:
   preparing a seed crystal having a boundary between a main plane and a non-polar side plane; and
   growing a group III nitride semiconductor from the non-polar side plane in a vapor phase,
   wherein the growing of the group III nitride semiconductor extends in a first direction and in a second direction different from the first direction, the first direction is the +C-axis direction of the seed crystal, a ratio of a growth level in the +C-axis direction to a growth level in the second direction is from 10 to 100, and the growing comprises growing the group III nitride semiconductor to form a U-shaped crystal comprising wall parts extending in the +C-axis direction of the seed crystal.

2. The method for producing a group III nitride semiconductor crystal according to claim 1, wherein the seed crystal is selected from the group consisting of sapphire, SiC, ZnO and a group III nitride semiconductor.

3. The method for producing a group III nitride semiconductor crystal according to claim 1, wherein the growing of the group III-V nitride semiconductor forms the wall parts nearly parallel to the non-polar side plane.

4. The method for producing a group III nitride semiconductor crystal according to claim 1, wherein the seed crystal has a flat plane part, and at least a part of the peripheral part of the flat plane part includes a straight line.

5. The method for producing a group III nitride semiconductor crystal according to claim 1, wherein the non-polar side plane is a plane having an off angle within a range of ±0.2° relative to the non-polar side plane of the seed crystal as measured at an accuracy within ±0.01°.

6. The method for producing a group III nitride semiconductor crystal according to claim 1, further comprising:
   forming a group III nitride semiconductor substrate having a C-plane;
   cutting the seed crystal such that the non-polar side plane of the group III nitride semiconductor substrate is exposed out; and
   providing the seed crystal to the growing of the group III nitride semiconductor.

7. The method for producing a group III nitride semiconductor crystal according to claim 6, wherein the seed crystal is cut through cleavage to form the non-polar side plane.

8. The method for producing a group III nitride semiconductor crystal according to claim 1, wherein the non-polar side plane is a {10-10} plane or a {11-20} plane.

9. The method for producing a group III nitride semiconductor crystal according to claim 1, wherein the growing comprises growing the group III nitride semiconductor according to an HVPE method, an MOCVD method or a sublimation method.

10. The method for producing a group III nitride semiconductor crystal according to claim 1, wherein the group III nitride semiconductor is $Al_{1-x}Ga_xN$, where $0 \leq x \leq 1$.

11. The method for producing a group III nitride semiconductor crystal according to claim 10, wherein the growing of the group III nitride semiconductor is attained in an atmosphere comprising at least GaCl and $NH_3$, and a partial pressure of GaCl is within a range of from $3 \times 10^1$ to $3 \times 10^4$ Pa and a partial pressure of $NH_3$ is within a range of from $1 \times 10^3$ to $3 \times 10^5$ Pa.

12. The method for producing a group III nitride semiconductor crystal according to claim 1, comprising separating a grown group III nitride semiconductor from the seed crystal.

13. The method for producing a group III nitride semiconductor crystal according to claim 1, wherein the boundary between the main plane and the non-polar side plane is a straight line.

* * * * *